United States Patent [19]

Kunikiyo et al.

[11] Patent Number: 5,845,105
[45] Date of Patent: Dec. 1, 1998

[54] METHOD OF SIMULATING SEMICONDUCTOR MANUFACTURE WITH PROCESS FUNCTIONS ACCORDING TO USER APPLICATION

[75] Inventors: Tatsuya Kunikiyo; Katsumi Eikyu; Kenichiro Sonoda; Masato Fujinaga; Kiyoshi Ishikawa; Norihiko Kotani, all of Hyogo, Japan

[73] Assignee: Mitsubishi Denki Kabushiki Kaisha, Tokyo, Japan

[21] Appl. No.: 551,307

[22] Filed: Nov. 1, 1995

[30] Foreign Application Priority Data

Apr. 7, 1995 [JP] Japan .................................. 7-082821

[51] Int. Cl.$^6$ .................................................. G06F 9/455
[52] U.S. Cl. ............................................................. 395/500
[58] Field of Search .................................. 364/488, 489, 364/490, 491, 528; 395/500, 352

[56] References Cited

U.S. PATENT DOCUMENTS

| 4,785,399 | 11/1988 | Evans et al. ............................. 395/352 |
| 5,481,475 | 1/1996 | Young .................................... 364/491 |
| 5,502,643 | 3/1996 | Fujinaga ................................. 364/488 |
| 5,621,652 | 4/1997 | Eakin ..................................... 364/490 |

FOREIGN PATENT DOCUMENTS

0599469A2  10/1993  European Pat. Off. .

OTHER PUBLICATIONS

Alvarez et al., "Application of Statistical Design and Response Surface Methods to Computer–Aided VLSI Device Design", *IEEE Transactions on Computer–Aided Desgn*, vol. 7, No. 2 (Feb. 1988), pp. 272–288.

Aoki et al., "A New Design–Centering Methodology for VLSI Device Development", *IEEE Transactions on Computer–Aided Design*, vol. CAD–6, No. 3 (May 1987), pp. 452–461.

Low et al., "An Efficient Methodology for Building Macromodels of IC Fabrication Processes", *IEEE Transactions on Computer–Aided Design*, vol. 8, No. 12 (Dec. 1989), pp. 1299–1313.

Marquardt, "An Algorithm for Least–Squares Estimation of Nonlinear Parameters", *J. Soc. Indust. Appl. Math*, vol. 11, No. 2 (Jun. 1963), pp. 431–441.

"MOSFET Two–Dimensional Doping Profile Determination" (N. Kalil and J. Faricelli, Simulation of Semiconductor Devices and Processes, vol. 5, pp. 365–368, Edited by S. Seberherr, H. Stippel, and E. Strasser, Sep. 1993, Springer–Verlag, Vienna).

*Primary Examiner*—Kevin J. Teska
*Assistant Examiner*—Dan Fiul
*Attorney, Agent, or Firm*—McDermott, Will & Emery

[57] ABSTRACT

A method of manufacturing a semiconductor device wherein the device is manufactured according to extracted process parameters. The process parameters are extracted as a set of optimum process parameters which satisfy an intended specification using process functions. The process functions describe a characteristic of the semiconductor device, and are determined using experimental values and/or simulated values. The process parameters may then be transmitted online to a factory.

22 Claims, 13 Drawing Sheets

METHOD OF SIMULATING SEMICONDUCTOR MANUFACTURE WITH PROCESS FUNCTIONS ACCORDING TO USER APPLICATION

BACKGROUND OF THE INVENTION

1. Field of the Invention

The present invention generally relates to a method of manufacturing a semiconductor device, and in particular to a method of manufacturing a semiconductor device in which process conditions for obtaining a semiconductor device satisfying a required specification can be rapidly extracted, thereby reducing a manufacturing process period of the semiconductor device.

2. Description of the Related Art

Very large-scale integrated circuits (VLSIs) are generally classified into general purpose semiconductor devices and application specific integrated circuits (ASICs). A DRAM (Dynamic Random Access Memory) and an SRAM (Static Random Access Memory) are examples of the general purpose semiconductor devices. A logic MOSLSI (Metal Oxide Semiconductor Large Scale Integrated Circuit) is a major example of the application specific integrated circuits. As for the ASIC, it is desired or required that a chip satisfying a specification requested by a customer is supplied within a short period, which is an important point in business.

Design technique and semiconductor manufacturing technique are both required in obtaining the chip satisfying the specification requested by the customer. Between them, a longer period is required for developing the manufacturing technique. The reason why a longer period is required for developing the manufacturing technique will be described below, for example, in connection with a method of manufacturing a conventional MOSFET (MOS Field Effect Transistor).

FIGS. 1 to 9 are schematic cross sections showing steps in the method of manufacturing the conventional MOSFET.

Referring to FIG. 1, a base oxide film 2 and a nitride film 3 are successively formed on a main surface of a semiconductor substrate 1.

Referring to FIG. 2, base oxide film 2 and nitride film 3 are patterned to form an opening 4 located above a portion at which an element isolating oxide film is to be formed.

Using nitride film 3 as a mask, as shown in FIG. 3, the main surface of semiconductor substrate 1 is oxidized to form an element isolating oxide film 5 at the main surface of semiconductor substrate 1. Referring to FIGS. 3 and 4, base oxide film 2 and nitride film 3 are removed. This method is called an LOCOS (LOCal Oxidation of Silicon) method.

Referring to FIG. 5, impurity ions 8 are directed to the surface of semiconductor substrate 1 to form a well layer 6 and a channel cut layer 7 for electrically isolating elements from each other.

Referring to FIG. 6, ions of, e.g., boron are implanted for forming a channel layer at an element region. This is called channel implantation. Then, a gate oxide film 9 and a polycrystalline silicon gate electrode 10 are successively deposited and patterned to form a gate 11.

Referring to FIG. 7, phosphorus ions 13 or the like are implanted into the semiconductor substrate for forming n⁻-source/drain layer 12.

Referring to FIG. 8, an oxide film is deposited on the semiconductor substrate, and then anisotropic etching is performed to form side wall oxide films 14 on the side surfaces of gate oxide film 9 and polycrystalline silicon gate electrode 10.

Referring to FIG. 9, arsenic ions 16 or the like are implanted into the semiconductor substrate for forming n⁺-source/drain layer 15. Then, the semiconductor substrate is thermally treated for electrically activating the implanted ions so that an MOSFET 17 is formed.

In connection with optimization of the steps of manufacturing the MOSFET described above, the conventional method of manufacturing the semiconductor device suffers from the following problems.

For developing a semiconductor device, it is necessary to extract the conditions of the manufacturing apparatus for manufacturing the semiconductor device which satisfies the specifications required by the client. These conditions are referred to as the "process conditions" in this specification. Each process condition affects a plurality of electric characteristics of the semiconductor device such as a threshold voltage, a breakdown voltage, a current driving capacity and reliability. For example, a thickness of a gate oxide film affects all of the threshold voltage, breakdown voltage, current driving capacity and reliability. Meanwhile, the threshold voltage may be affected by process conditions such as the thickness of gate oxide film, the condition for forming source/drain and condition for channel doping.

In order to extract the process conditions satisfying all the intended specifications, semiconductor devices are manufactures by way of trial in the prior art with different values of each process condition, and electrical characteristics are measured for searching optimum values. An example will be described below.

In the following example, it is assumed that an n-type MOS transistor to be developed must satisfy the specifications that a threshold voltage is 0.5 V when a drain voltage is 0.2 V, and that a drain current is 4.5 mA when the drain voltage is 3 V. Among the process conditions, a channel dose is varied while fixing a channel implantation energy to 40 keV, and an n⁻-source/drain implantation energy is varied, while fixing a dose to $1.0 \times 10^{14}/cm^2$. The process conditions are shown in the following Table 1.

TABLE 1

| Wafer No. | Channel Doze @ 40 keV | n-Implantation Energy @ 1 × 10¹⁴/cm² |
|---|---|---|
| 1 | 1 × 10¹⁰/cm² | 10 kev |
| 2 |  | 20 kev |
| 3 |  | 30 keV |
| 4 |  | 40 keV |
| 5 | 1 × 10¹¹/cm² | 10 keV |
| 6 |  | 20 keV |
| 7 |  | 30 keV |
| 8 |  | 40 keV |
| 9 | 1 × 10¹²/cm² | 10 keV |
| 10 |  | 20 kev |
| 11 |  | 30 keV |
| 12 |  | 40 keV |
| 13 | 1 × 10¹³/cm² | 10 keV |
| 14 |  | 20 keV |
| 15 |  | 30 keV |
| 16 |  | 40 keV |

Electrical characteristics of transistors with various process conditions are shown in a graph in FIG. 10 in which the abscissa represents measured value of the threshold voltage and the ordinate represents measured value of the drain current. Referring to FIG. 10, a relationship between the channel dose and the electric characteristic is represented by a plurality of lines 18. A relationship between the n⁻-source/drain implantation energy and the electric characteristic is represented by a group of lines 19. Crossings between lines 18 and 19 indicated by circled numbers 1–16 represent measured values, and these numbers represent the wafer numbers in the table 1.

In FIG. 10, the intended or required specification is represented by a point 21. According to FIG. 10, this specification can be optimally satisfied with the channel dose of $2.0 \times 10^{12}/cm^2$ and the n⁻-source/drain implantation energy of 30 keV.

If the number of the process conditions to be varied and the characters specified in the specification are both two, the optimum values in the process conditions can be determined from a graph drawn as shown in FIG. 10. However, if the number of such characteristics are three or more, statistical search of the optimum values is very difficult. If it were attempted to search the optimum values from the graph as shown in FIG. 10 in accordance with the conventional manner, it would take a very long time, so that a long term and a large cost would be required for the development. Since the conventional method is based on the experimental values, an optimum result or solution cannot be found if the optimum result is included in the process conditions with which the experiment has not been performed.

SUMMARY OF THE INVENTION

Accordingly, it is an object of the invention to provide a method of manufacturing a semiconductor device in which a semiconductor device satisfying an intended specification can be developed with a shorter term and a lower cost than those in the prior art.

A method of manufacturing a semiconductor device according to the invention includes the steps of describing a characteristic of the semiconductor device with a process function of a process parameter in a process of manufacturing the semiconductor device, extracting a set of optimum parameters satisfying an intended specification using the process function, and manufacturing the semiconductor device by the manufacturing process according to the extracted process parameters.

According to this invention, since influence of each process step on the characteristic of the semiconductor device is represented in a form of the process function, it is possible to find, based on the intended specification, the parameter value satisfying the intended specification by numerical calculation. Although a plurality of process conditions are related to one characteristic, it is possible to optimize the plurality of process conditions at one time by quantifying the relationship between these process conditions. As a result, the invention can provide the method in which the semiconductor device satisfying the intended specification can be developed with a reduced term and a reduced cost.

Preferably, in the step of describing the characteristic of the semiconductor device with the process function, the process function is determined based on an experimental value. Since the process function is determined using the experimental value obtained in the past, it is possible to determine a highly reliable function. Even in connection with condition for which an experiment was not performed, the condition satisfying the specification can be found easily by interpolation or extrapolation of the process function. Consequently, the semiconductor device satisfying the specification can be developed with a short time and a low cost.

According to an embodiment, the step of describing the characteristic of the semiconductor device with the process function includes the step of determining the process function based on a simulated value. Since the process function is determined from the simulated value, conditions for which the experiment was not performed can be reflected in the process function.

In another experiment, the step of describing the characteristic of the semiconductor device with the process function includes the step of determining the process function using both an experimental value and a simulated value. With respect to the process parameter, it is possible to determine the process function which is highly accurate and is effective with respect to a wide condition range. From a value in the specification, it is possible to derive the parameter value attaining the same by numerical calculation.

In still another embodiment, the process function is described with a plurality of linear functions. More specifically, the parameter function is divided into a plurality of regions, in each of which the characteristic of the semiconductor device is represented as a linear function. The numerical calculation for extracting the parameter can be performed more easily than the case where the linear function is not used.

In yet another embodiment, the step of describing the characteristic of the semiconductor device with the process function includes the step of determining a plurality of process functions each describing a characteristic given by corresponding one of process steps to the semiconductor device, and the step of representing each of the characteristics of the semiconductor device by linear combination of the plurality of process functions.

Each process function is represented by the linear combination of the process functions, and each process function describes the characteristic to be given to one of the electrical characteristics of the semiconductor device. The process function setting a relationship between the plurality of characteristics and the process parameters can be expressed by a matrix form. This allows easy numerical calculation for extracting the parameters.

In yet another embodiment, the step of extracting the process parameters uses a Gauss-Newton method, a Levenberg-Marquardt method, a Denis-Gay-Welsch method or a Biggs method.

The Gauss-Newton method can provide a good convergent property with respect to a problem of a relatively strong linearity. The Levenberg-Marquardt method is stable with respect to a problem of a relatively strong nonlinearity, and can provide rapid convergence. Since the Denis-Gay-Welsch method and the Biggs method have a relatively large convergence radius and little initial value dependency, the parameters can be extracted surely and stably. Therefore, extraction of the parameter can be efficiently performed in accordance with properties of the respective problems. In this case, the initial values may be determined with random numbers. By determining the initial values with random numbers and repeating the extraction, a plurality of minimum values can be found, and the smallest value in a global range can be extracted.

In yet another embodiment, the step of extracting the process parameters uses a simulated-annealing method. With respect to a problem having a plurality of minimum values, the smallest value can be found in a wide region. The smallest value can be globally searched by increasing a range of the value of the parameter.

In yet another embodiment, the step of extracting the process parameters includes the step of determining upper and lower limits of the process parameters and extracting the process parameters in a range between the upper and lower limits. Thereby, the parameters having a physical meaning can be extracted.

In still another embodiment, the step of extracting the process parameters includes the step of limiting a range for deriving the process parameters to a range in which the process parameter changes monotonously, and the optimum process parameters are extracted from the limited range. Thereby, the number of minimum values can be reduced, so that the parameters can be extracted more efficiently.

In the step of extracting the process parameter, all the process parameters may be extracted at one time. Alternatively, a part of the process parameters may be initially extracted at one time, in which case values of the extracted process parameters are then fixed, and the remaining process parameters are extracted. In this case, only the process parameters of a high sensitivity among the process parameters are initially extracted, values of the process parameters of a high sensitivity are then fixed to the extracted values, and then the process parameters of a low sensitivity are extracted, whereby extraction of the parameters can be performed more efficiently.

When a plurality of optimum results are found, sensitivity analysis may be performed on each of the plurality of optimum results for selecting the optimum results, which are determined to have the lowest sensitivity, as a set of the optimum process parameters. Thereby, the optimum value having a large process margin can be determined.

In yet another embodiment, the extracted process parameters are transmitted to a manufacturing factory via a transmitting system, and the semiconductor device is manufactured in accordance with the condition complying with the transmitted parameters in the manufacturing factory. Thereby, the development term can be shorter than that in the prior art.

In still another embodiment, if a certain process function is a function of a plurality of process parameters, the step of describing the characteristic with the process function includes the step of fixing a part of the process parameters to a plurality of values, respectively, and variously changing the remaining process parameters to find a distribution range of the function values of the process function with respect to each value of the remaining process parameters, and the step of extracting a central value in the found distribution range with respect to each value of the remaining process parameters and determining a series of the central values as the process function.

Since the process function is always specified with the central values, the process function is not significantly affected by variation of a specific parameter. Even if a specific process parameter varies, the found characteristic do not deviate from the specification to a large extent, because the value of the process function is an average of the process function values.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Embodiments of the invention will be described below.
[Embodiment 1]

Figure 1:
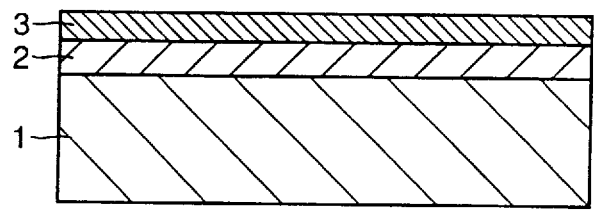
FIGS. 1 to 9 schematically show steps in a conventional method of manufacturing an MOSFET, respectively.
Figure 2:
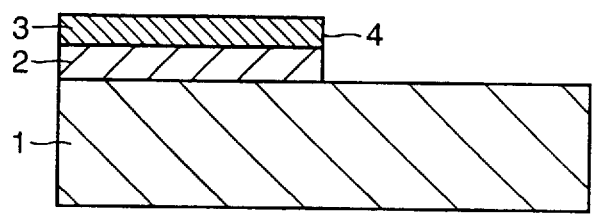
Figure 3:
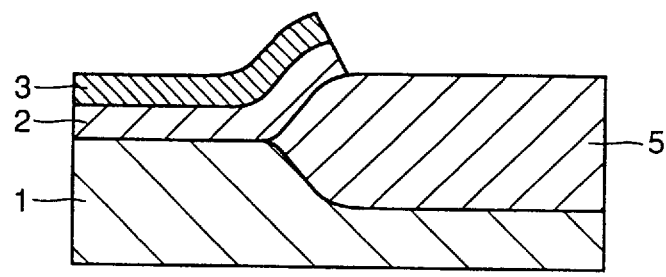
Figure 4:
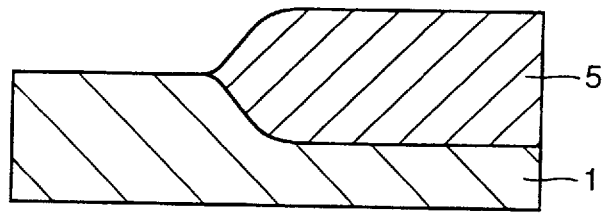
Figure 5:
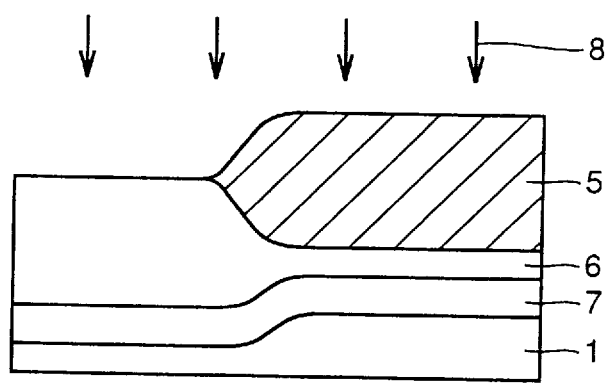
Figure 6:
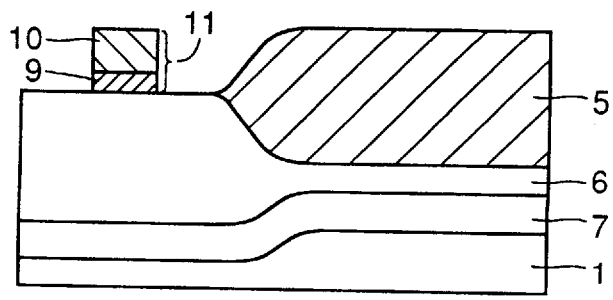
Figure 7:
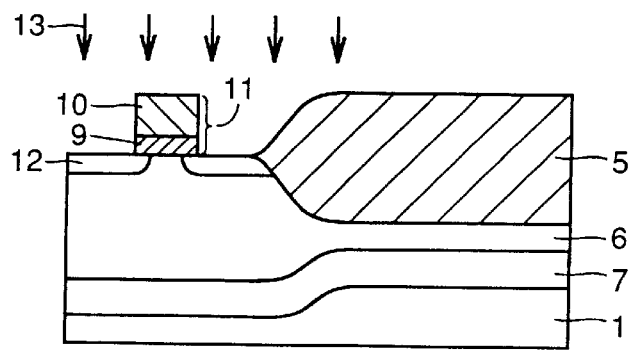
Figure 8:
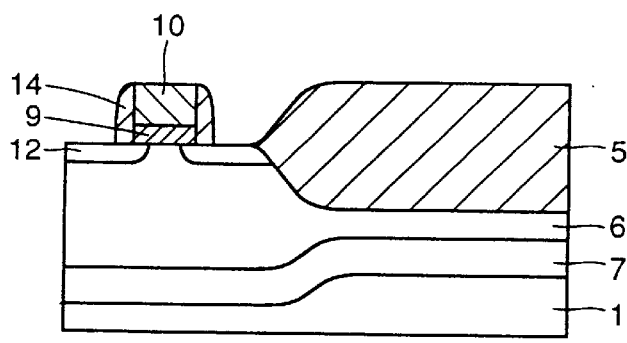
Figure 9:
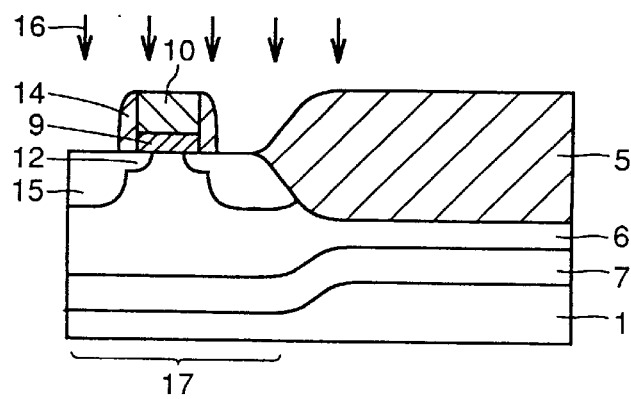
Figure 10:
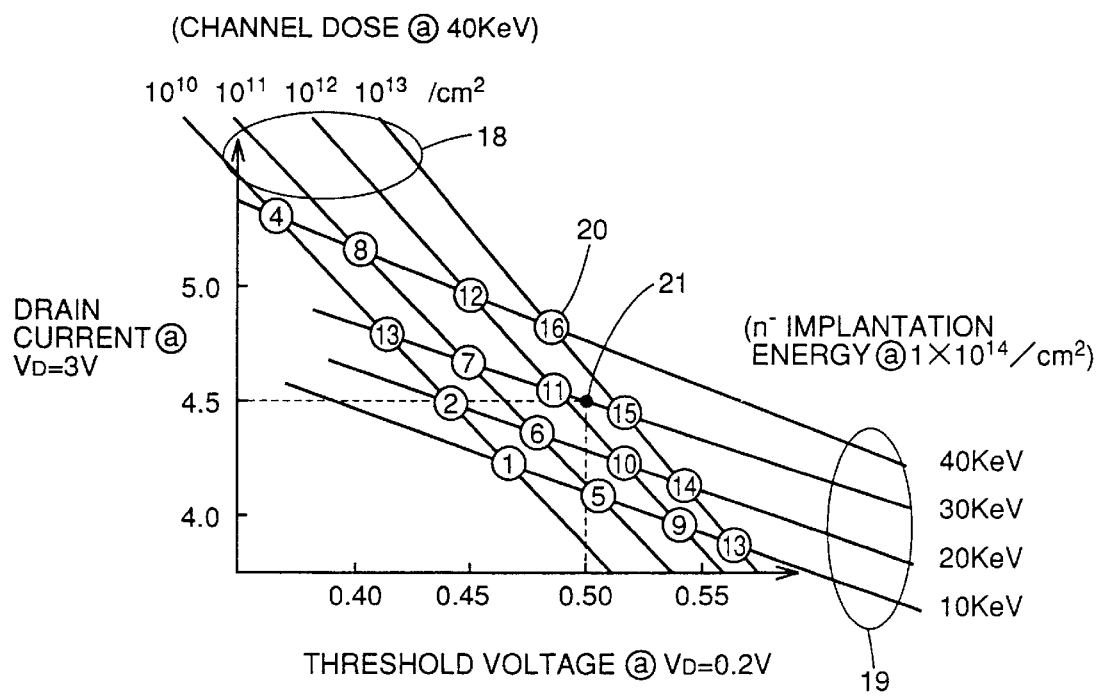
FIG. 10 is a graph showing electrical characteristics of a transistor exhibited by changing a process condition.
Figure 11:
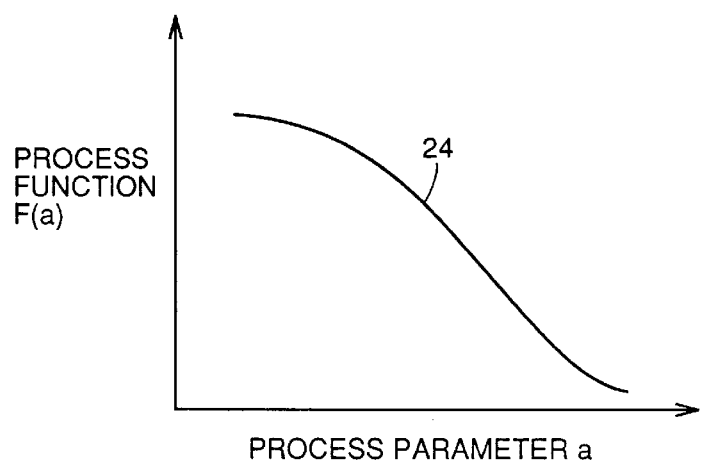
FIG. 11 shows an example of a relationship of a process parameter and a process function of the same.

FIG. 11 shows a curve 24 representing an example of a process function F(a) of a process parameter a. The process parameter means a condition in a step of manufacturing a semiconductor device. What is described by the process function is a characteristic of a semiconductor device element to be manufactured. This characteristic is not restricted to an electrical characteristic.

For example, if electrical characteristics specified in the specification are a threshold voltage ($V_{TH}$), a current driving capacity ($G_m$), a breakdown voltage (BV) and a substrate constant (K), process parameters may be a gate oxide film thickness ($t_{ox}$), a channel dose ($D_c$), a side wall width ($W_s$), an ion implantation energy of n$^-$-source/drain ($E_{sd}$), and a heat treatment time ($t_a$), in which case each electrical characteristic can be expressed by the following formula (1).

$$V_{TH}=a_1F_1(t_{ox})+a_2F_2(D_c)+a_3F_3(W_s)+a_4F_4(E_{sd})+a_5F_5(t_a)$$

$$G_m=b_1G_1(t_{ox})+b_2G_2(D_c)+b_3G_3(W_s)+b_4G_4(E_{sd})+b_5G_5(t_a)$$

$$BV=c_1H_1(t_{ox})+c_2H_2(D_c)+c_3H_3(W_s)+c_4H_4(E_{sd})+c_5H_5(t_a)$$

$$K=d_1I_1(t_{ox})+d_2I_2(D_c)+d_3I_3(W_s)+d_4I_4(E_{sd})+d_5I_5(t_a) \quad (1)$$

In the formula (1), $F_1$, $G_1$, $H_1$ and $I_1$ are process functions of a gate oxide film related to a gate oxidizing step. $F_2$, $G_2$, $H_2$ and $I_2$ are process functions of a channel dose related to channel ion implantation. $F_3$, $G_3$, $H_3$ and $I_3$ are process functions of a side wall width related to a side wall formation step. $F_4$, $G_4$, $H_4$ and $I_4$ are process functions of an ion implantation energy related to an n$^-$-source/drain formation step. $F_5$, $G_5$, $H_5$ and $I_5$ are process functions of a heat treatment time related to a heat treatment step. $a_i$, $b_i$, $c_i$ and $d_i$ (i=1, 2, 3, 4, 5) are parameters for linear combination of these process functions. It should be noted that these are not the "process parameters". In the example represented by the formula (1), the process function has only one argument. Process functions including two or more arguments may be expressed in similar forms.

Each process function and each parameter can be determined, for example, from experimental values. In this case, reliability can be improved by storing and utilizing the experimental results obtained in the past. If an experimental value for a certain condition is not available, it is possible to determine the process function and parameter by utilizing a calculation result of a semiconductor process simulation. By utilizing the calculation result of simulation, it is possible to determine the optimum process parameters for which an experiment cannot be performed easily.

Description will now be given on a method of finding the optimum process parameters in a case where the threshold voltage should be $V_{TH}^*$, the current driving capacity should be $G_m^*$, the breakdown voltage should be $BV^*$ and the substrate constant should be $K^*$ according to the electrical characteristics specified in the specification.

Figure 12:
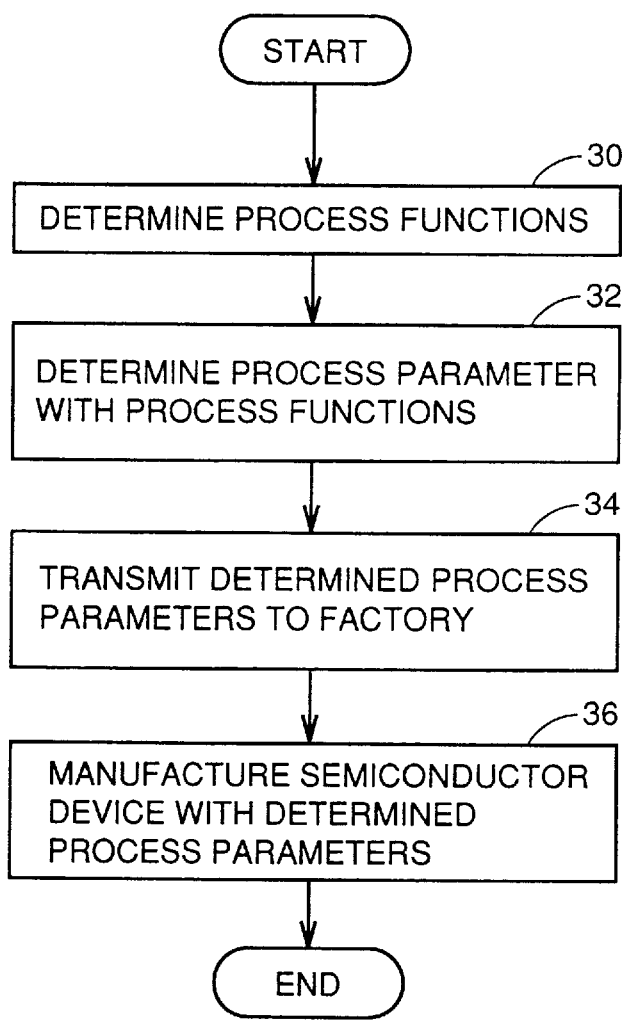
FIG. 12 is a flow chart schematically showing steps in a method of manufacturing a semiconductor device according to the invention.

FIG. 12 shows steps of manufacturing the semiconductor device according to the first embodiment of the invention. First, the process function is set (step 30), and then the process parameter is determined with this process function (step 32). The determined process parameter is transmitted online to a manufacturing factory via a LAN (Local Area Network), a satellite communication, a privately leased line or a public telephone line (step 34), and the semiconductor device is manufactured using the transmitted process parameter (step 36).

Figure 13:
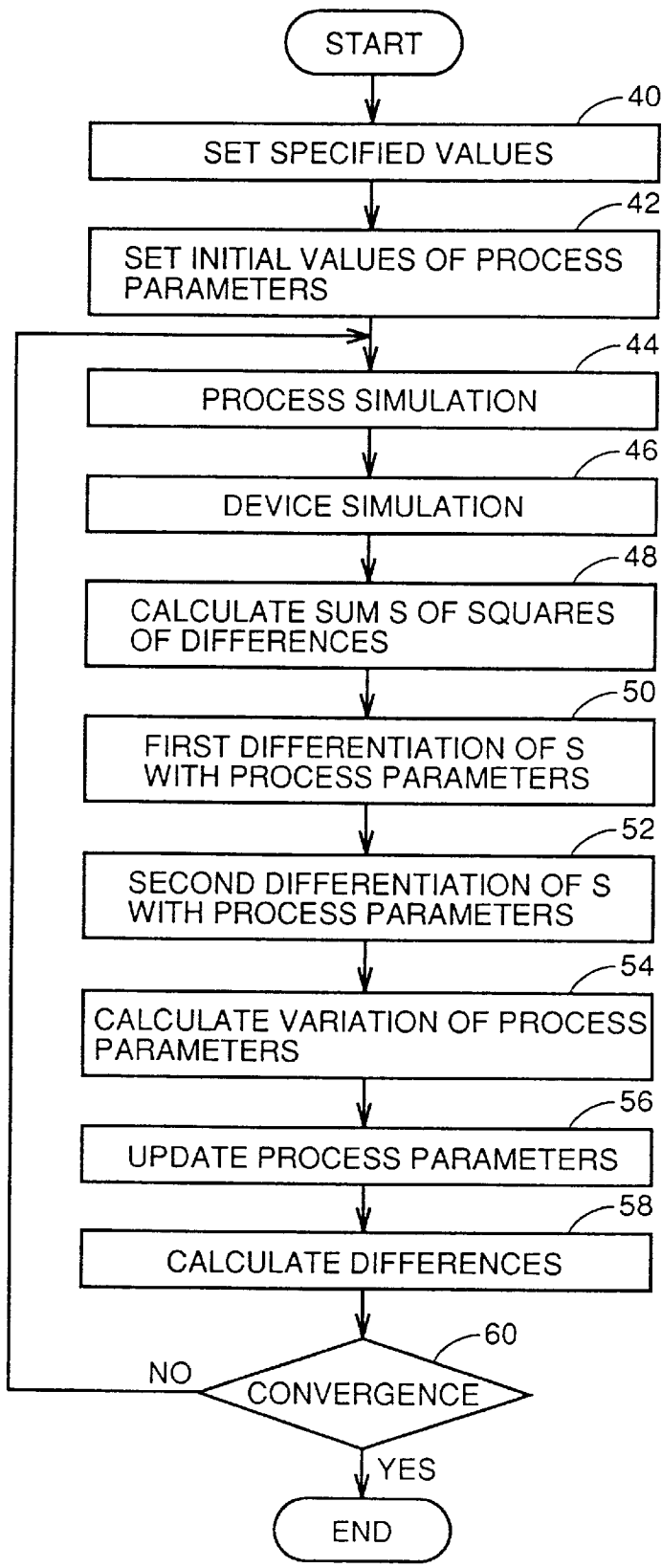
FIG. 13 is a flow chart showing steps of extracting a process parameter in a first embodiment of the invention.

Referring to FIG. 13, setting of the specification value is first performed in the step 32 of determining the process parameter (step 40). Then, the initial value of the process parameter is set (step 42). If the same or similar specification was imposed in the past, the optimum process parameter values determined in the past are set as the initial values. This corresponds to substitution of the initial values of the process parameter in the above formula (1). If the specification is new, the initial values may be determined from random numbers. For example, by repeating several times the step of determining the initial value from random numbers and finding the optimum result based on the same, the most optimum values among them can be selected, so that the optimum values can be globally selected.

In the next step 48, calculation is performed to find the sum of squares of differences between the values of the electrical characteristics represented by the process functions thus determined and the values in the specification (step 48). This is expressed in the following formula (2).

$$S = w_1(V_{TH} - V_{TH}^*)^2 + w_2(G_m - G_m^*)^2 + w_3(BV - B^*V)^2 + w_4(K - K^*)^2 \quad (2)$$

In the formula (2), S is the sum of the squares, and $w_i$ (i=1, 2, 3, 4, 5) represents a weight. By adjusting the weights, priority can be given to the values specified in the specification to decide the values to be accomplished with the highest priority.

Assuming that the sum of squares S is minimum with the process parameters $t_{ox}\#$, $D_c\#$, $W_s\#$, $E_{sd}\#$ and $t_a\#$, the following formula (3) is satisfied.

$$\left.\frac{\partial S}{\partial t_{ox}}\right|_{t_{ox}=t_{ox}\#} = 0, \quad \left.\frac{\partial S}{\partial D_c}\right|_{D_c=D_c\#} = 0 \quad (3)$$

$$\left.\frac{\partial S}{\partial w_s}\right|_{W_s=W_s\#} = 0, \quad \left.\frac{\partial S}{\partial E_{sd}}\right|_{E_{sd}=E_{sd}\#} = 0$$

$$\left.\frac{\partial S}{\partial t_a}\right|_{t_a=t_a\#} = 0$$

In order to find the result satisfying the formula (3), this embodiment utilizes the Newton method. The following formula (4) results from Taylor's expansion of quantities derived from differentiation of S with the process parameters.

$$\left.\frac{\partial S}{\partial x_j}\right|_{\underline{x}=\hat{\underline{x}}} = \left.\frac{\partial S}{\partial x_j}\right|_{\underline{x}=\underline{x}(q)} + \sum_{k=1}^{m} \left.\frac{\partial^2 S}{\partial x_j \partial x_k}\right|_{\underline{x}=\underline{x}(q)} \Delta \underline{x} + \ldots = 0 \quad (4)$$

$$(j, k = 1, 2, \ldots, m)$$

where m is 5 in this example, $\underline{x}$ is an optimum value vetor, $\underline{x}^{(q)}$ is a qth vector of approximate values of process parameters. In this specification and drawings, underlined small letters represent vectors, and underlined capital letters represent matrixes.

During repetitive calculation in this manner, the vector $\underline{x}^{(q)}$ can be expressed by the following formula (5) where it is assumed that approximate values of the qth process parameters are $t_{ox}^{(q)}$, $D_c^{(q)}$, $W_s^{(q)}$, $E_{sd}^{(q)}$ and $t_a^{(q)}$. Components x1, x2, x3, x4 and x5 of vector $\underline{x}^{(q)}$ correspond to $t_{ox}^{(q)}$, $D_c^{(q)}$, $W_s^{(q)}$, $E_{sd}^{(q)}$ and $t_a^{(q)}$ respectively.

$$\underline{x}^{(q)} = \begin{bmatrix} t_{ox}^{(q)} \\ D_c^{(q)} \\ W_s^{(q)} \\ E_{sd}^{(q)} \\ t_a^{(q)} \end{bmatrix} \quad (5)$$

In the middle side of the formula (4), the first term represents the 0th term, the second term represents the 1st term, and subsequent terms represent 2nd and higher terms, respectively. In the formula (4), if the second and higher terms are ignored, the following formula (6) is obtained.

$$\sum_{k=1}^{m} \left.\frac{\partial^2 S}{\partial x_j \partial x_k}\right|_{\underline{x}=\underline{x}(q)} \Delta \underline{x} = -\left.\frac{\partial S}{\partial x_j}\right|_{\underline{x}=\underline{x}(q)} \quad (6)$$

$$(\Delta \underline{x} = \underline{x} - \underline{x}^{(q)})$$

The formula (6) can be expressed more specifically by the following formula (7).

$$\begin{bmatrix} \frac{\partial^2 S}{\partial t_{ox}^2} & \frac{\partial^2 S}{\partial t_{ox}\partial D_c} & \frac{\partial^2 S}{\partial t_{ox}\partial W_s} & \frac{\partial^2 S}{\partial t_{ox}\partial E_{sd}} & \frac{\partial^2 S}{\partial t_{ox}\partial t_a} \\ \frac{\partial^2 S}{\partial D_c\partial t_{ox}} & \frac{\partial^2 S}{\partial D_c^2} & \frac{\partial^2 S}{\partial D_c\partial W_s} & \frac{\partial^2 S}{\partial D_c\partial E_{sd}} & \frac{\partial^2 S}{\partial D_c\partial t_a} \\ \frac{\partial^2 S}{\partial W_s\partial t_{ox}} & \frac{\partial^2 S}{\partial W_s\partial D_c} & \frac{\partial^2 S}{\partial W_s^2} & \frac{\partial^2 S}{\partial W_s\partial E_{sd}} & \frac{\partial^2 S}{\partial W_s\partial t_a} \\ \frac{\partial^2 S}{\partial E_{sd}\partial t_{ox}} & \frac{\partial^2 S}{\partial E_{sd}\partial D_c} & \frac{\partial^2 S}{\partial E_{sd}\partial W_s} & \frac{\partial^2 S}{\partial E_{sd}^2} & \frac{\partial^2 S}{\partial E_{sd}\partial t_a} \\ \frac{\partial^2 S}{\partial t_a\partial t_{ox}} & \frac{\partial^2 S}{\partial t_a\partial D_c} & \frac{\partial^2 S}{\partial t_a\partial W_s} & \frac{\partial^2 S}{\partial t_a\partial E_{sd}} & \frac{\partial^2 S}{\partial t_a^2} \end{bmatrix} \begin{bmatrix} \Delta t_{ox} \\ \Delta D_c \\ \Delta W_s \\ \Delta E_{sd} \\ \Delta t_a \end{bmatrix} = - \begin{bmatrix} \frac{\partial S}{\partial t_{ox}} \\ \frac{\partial S}{\partial D_c} \\ \frac{\partial S}{\partial W_s} \\ \frac{\partial S}{\partial E_{sd}} \\ \frac{\partial S}{\partial t_a} \end{bmatrix} \quad (7)$$

By finding the variation $\Delta \underline{x}$ in the formula (7), the (q+1)th approximate values are expressed by the following formula (8).

$$\underline{x}^{(q+1)} = \underline{x}^{(q)} + \Delta \underline{x} \tag{8}$$

Calculation of the formulas (7) and (8) are repeated, and it is determined that convergence of $\underline{x}$ occurs when a difference between the calculated value of the characteristic of the semiconductor device and the specified value decreases below a predetermined value. This flow is shown by steps 44–60 in FIG. 13.

From the above calculation, the optimum process parameters can be find at one time. In the above description, differentiation is performed twice for the process parameters of the sum S of squares of differences. However, a large load is caused by calculating twice the differentiation. Accordingly, the following manner is actually employed for the calculation.

The formula (2) can be rewritten into the following generalized formula (9).

$$S(x) = \sum_{i=1}^{n} w_i(y_i - f_i(\underline{x}))^2 \tag{9}$$

In the formula (9), S is the sum of squares, $w_i$ is a weight, $y_i$ is a measured value, $f_i$ is a model formula and $x_i$ is a parameter. The derivative of the second order of S for respective parameters can be calculated by the following formulas (10) and (11).

$$-\frac{\partial S}{\partial x_j} = 2 \sum_{i=1}^{n} \frac{\partial f_i}{\partial x_j} w_i[y_i - f_i(\underline{x})] \tag{10}$$

$$\frac{\partial^2 S}{\partial x_j \partial x_k} = 2 \sum_{i=1}^{n} \left[ \frac{\partial f_i}{\partial x_j} w_i \frac{\partial f_i}{\partial x_k} - \frac{\partial^2 f_i}{\partial x_j \partial x_k} w_i(y_i - f_i(\underline{x})) \right] \tag{11}$$

By ignoring the second term in the right side of the formula (11) and expressing the first differential in the form of Jacobian matrix $\underline{A}$, the formula (6) can be rewritten into the following formula (12).

$$\begin{aligned} ({}^t\underline{A}W\underline{A})\Delta \underline{x} &= \underline{A}^t W(\underline{y} - f(\underline{x})) \\ &= \underline{A}^t W \underline{v} \\ &= \underline{b} \end{aligned} \tag{12}$$

The superscript "t" of the matrix means transpose of a matrix. W is the matrix of weights. The vector $\underline{v}$ in the formula (12) is called a residual vector. If the models are n in number and the parameters are m in number, the Jacobian matrix $\underline{A}$ can be expressed as follows.

$$\underline{A} = \begin{pmatrix} \frac{\partial f_1}{\partial x_1} & \frac{\partial f_1}{\partial x_2} & \cdots & \frac{\partial f_1}{\partial x_m} \\ \frac{\partial f_2}{\partial x_1} & \frac{\partial f_2}{\partial x_2} & \cdots & \frac{\partial f_2}{\partial x_m} \\ \vdots & \vdots & & \vdots \\ \frac{\partial f_n}{\partial x_1} & \frac{\partial f_n}{\partial x_2} & \cdots & \frac{\partial f_n}{\partial x_m} \end{pmatrix} \tag{13}$$

In the actual calculation, the following formula (14) is solved (formula (15)), and the parameters are updated using the derived variation $\Delta \underline{x}$. This calculation is repeated until convergence of the value of S occurs.

$$\underline{A}\Delta \underline{x} = \underline{v} \tag{14}$$

$$\Delta \underline{x} = \underline{A}^{-1}\underline{v} \tag{15}$$

The manner of calculation, in which the derivative of the second order in the formula (11) is ignored and the formula (6) is transformed into the formula (14) as described above, is called the Gauss-Newton method. According to the Gauss-Newton method, the optimum process parameters can be easily found with respect to a relatively linear problem.

In order to find the process parameters, upper and lower limits thereof must be set in some cases. The purpose of this is to remove in advance the values of the process parameters which corresponds to those situations which the semiconductor manufacturing apparatus cannot afford. For example, it is necessary to remove in advance the value corresponding to the incident angle of 90 degrees in connection with the ion implantation.

Calculation in the minimum squaring method for setting the range of values of the parameters can be performed as follows. For the case where the number of the parameters are five, i.e., $t_{ox}$, $D_c$, $W_s$, $E_{sd}$ and $t_a$, it is assumed that the range of parameter $W_s$ satisfies the relationship of $W_s\text{min} < W_s < W_s\text{max}$.

When the value of parameter $W_s$ is in this range, the calculation can be performed by the following formula (16).

$$\begin{bmatrix} \frac{\partial F_1}{\partial t_{ox}} & \frac{\partial F_1}{\partial D_L} & \frac{\partial F_1}{\partial W_s} & \frac{\partial F_1}{\partial E_{sd}} & \frac{\partial F_1}{\partial t_a} \\ \frac{\partial F_2}{\partial t_{ox}} & \frac{\partial F_2}{\partial D_L} & \frac{\partial F_2}{\partial W_s} & \frac{\partial F_2}{\partial E_{sd}} & \frac{\partial F_2}{\partial t_a} \\ \frac{\partial F_3}{\partial t_{ox}} & \frac{\partial F_3}{\partial D_L} & \frac{\partial F_3}{\partial W_s} & \frac{\partial F_3}{\partial E_{sd}} & \frac{\partial F_3}{\partial t_a} \\ \frac{\partial F_4}{\partial t_{ox}} & \frac{\partial F_4}{\partial D_L} & \frac{\partial F_4}{\partial W_s} & \frac{\partial F_4}{\partial E_{sd}} & \frac{\partial F_4}{\partial t_a} \end{bmatrix} \cdot \Delta \underline{x} = \underline{v} \quad (16)$$

It is assumed that $W_s$ does not fall in the set range after calculation of the formula (16). In this case, the following formula (17) must be solved in the next repetitive calculation.

$$\begin{bmatrix} \frac{\partial F_1}{\partial t_{ox}} & \frac{\partial F_1}{\partial D_L} & \frac{\partial F_1}{\partial E_{sd}} & \frac{\partial F_1}{\partial t_a} \\ \frac{\partial F_2}{\partial t_{ox}} & \frac{\partial F_2}{\partial D_L} & \frac{\partial F_2}{\partial E_{sd}} & \frac{\partial F_2}{\partial t_a} \\ \frac{\partial F_3}{\partial t_{ox}} & \frac{\partial F_3}{\partial D_L} & \frac{\partial F_3}{\partial E_{sd}} & \frac{\partial F_3}{\partial t_a} \\ \frac{\partial F_4}{\partial t_{ox}} & \frac{\partial F_4}{\partial D_L} & \frac{\partial F_4}{\partial E_{sd}} & \frac{\partial F_4}{\partial t_a} \end{bmatrix} \cdot \Delta \underline{x} = \underline{v} \quad (17)$$

In this case, if $W_s$ is larger than $W_s$max, $W_s$ is fixed to $W_s$max ($W_s=W_s$max), and, if $W_s$ is smaller than $W_s$min, $W_s$ is fixed to $W_s$min ($W_s=W_s$min). Also, at the matrix in the left side of the formula (17), one of the rows relating to differential for $W_s$ is removed to form the matrix of 4×4. Then, variations $\Delta t_{ox}$, $\Delta D_c$, $\Delta E_{sd}$ and $\Delta t_a$ of the parameters other than $W_s$ are calculated. In this manner, the formula (16) is calculated as long as $W_s$ is within the range. When $W_s$ no longer falls in the range, $W_s$ is fixed to the value within the range and the formula (17) is calculated. In this manner, all the calculations are repeated until the variations sufficiently decrease.

Figure 14:
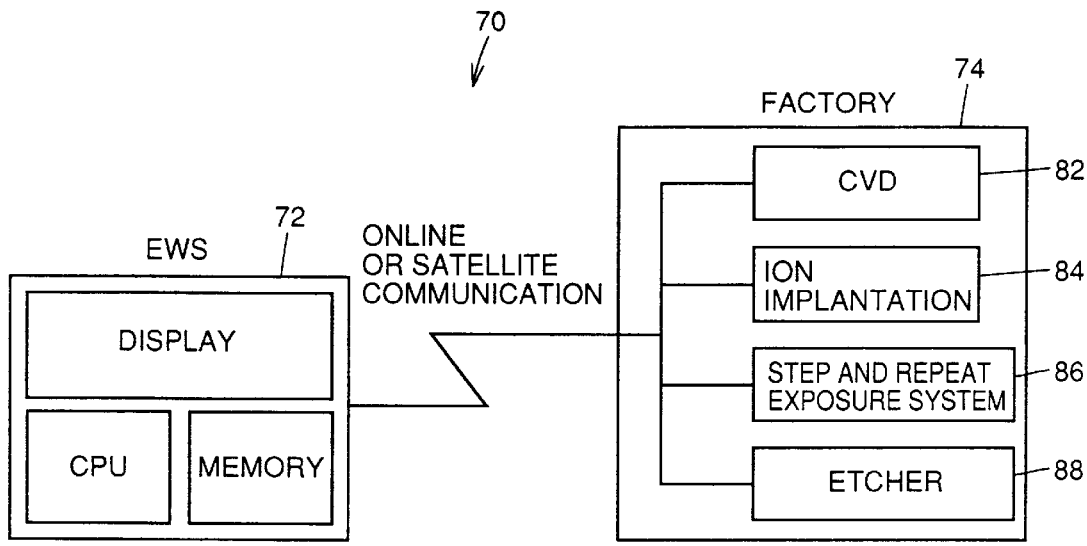
FIG. 14 schematically shows transmission of the process parameter.

FIG. 14 schematically shows the step of sending the process parameters thus found and manufacturing the semiconductor devices. Referring to FIG. 14, the function of extracting the optimum parameters is accomplished by a program, which runs on an EWS (Engineering Work Station) 72. EWS 72 may have a common structure. EWS 72 is connected online or via satellite line to a manufacturing factory 74, and the extracted optimum parameters are sent to a semiconductor manufacturing factory 74. In semiconductor manufacturing factory 74, the transmitted process parameters are used in a CVD device 82, an ion implanting device 84, an exposure system 86 and an etching element 88 for manufacturing semiconductor devices.

As described above, the apparatus having the function of extracting the process parameters is connected online to the semiconductor manufacturing apparatus, whereby the semiconductor device satisfying the required specification can be manufactured within a period shorter than that in the prior art. Further, by linking the engineering work station and the semiconductor manufacturing apparatus via the satellite line, a similar advantage can be achieved even if a place for design is remote from a place for manufacturing the semiconductor apparatus.

The embodiment has been described in connection with the case where the Gauss-Newton method is used as the method of extracting the optimum process parameters. This method, however, is instable with respect to a problem having strong nonlinearity. For the problem having strong nonlinearity, the Levenberg-Marquardt method may be used instead of the Gauss-Newton method, whereby the optimum process parameters can be extracted. Further, the Denis-Gay-Welsch method or the Biggs method may be used. Since these methods take even a secondary differential term into consideration, a convergence radius is larger than that in the Levenberg-Marquardt method, and initial dependency is small. Therefore, the optimum process parameters can be extracted more stably and surely with respect to the problem of strong nonlinearity.

[Embodiment 2]

Figure 15:
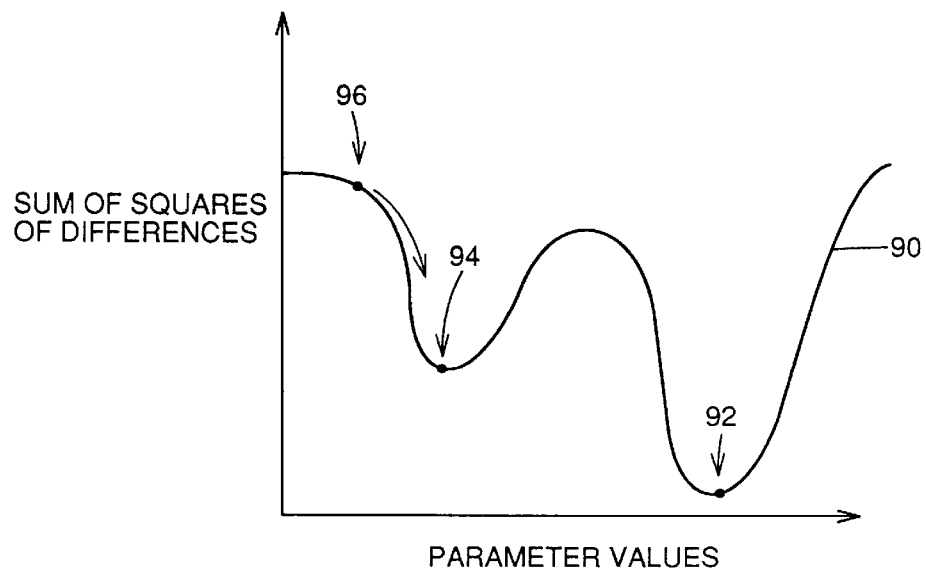
FIG. 15 schematically shows dependency of an extracted parameter value on an initial value.

As described before, the optimum process parameters can be extracted with the Gauss-Newton method or Levenberg-Marquardt method. However, these methods exhibit a problem that the convergence result depends on the initial value of the parameter. For example, as schematically shown by a curve 90 in FIG. 15, it is assumed that the curve of sum of squares of differences has minimum values at two points with respect to the parameter value. In this case, if the parameter extraction starts from the initial value indicated by numeral 96 in accordance with the method described above, the minimum value 94 will be extracted. As shown in FIG. 15, however, such a situation may occur that a minimum value 92 is actually the most optimum parameter. Thus, the process parameter which is found as the convergence result in the above method is not always the smallest value.

In order to avoid this problem as far as possible, the embodiment 2 uses the following method. First, the initial value is determined from random numbers, and the calculation starting from the initial value thus determined is performed to obtain the result in accordance with the calculation method of the embodiment 1. By repeating such calculation multiple times, a plurality of results are found, and the smallest sum of the squares of differences among them is selected as the result. Thereby, it is possible to find the parameter of or close to the minimum value.

Figure 16:
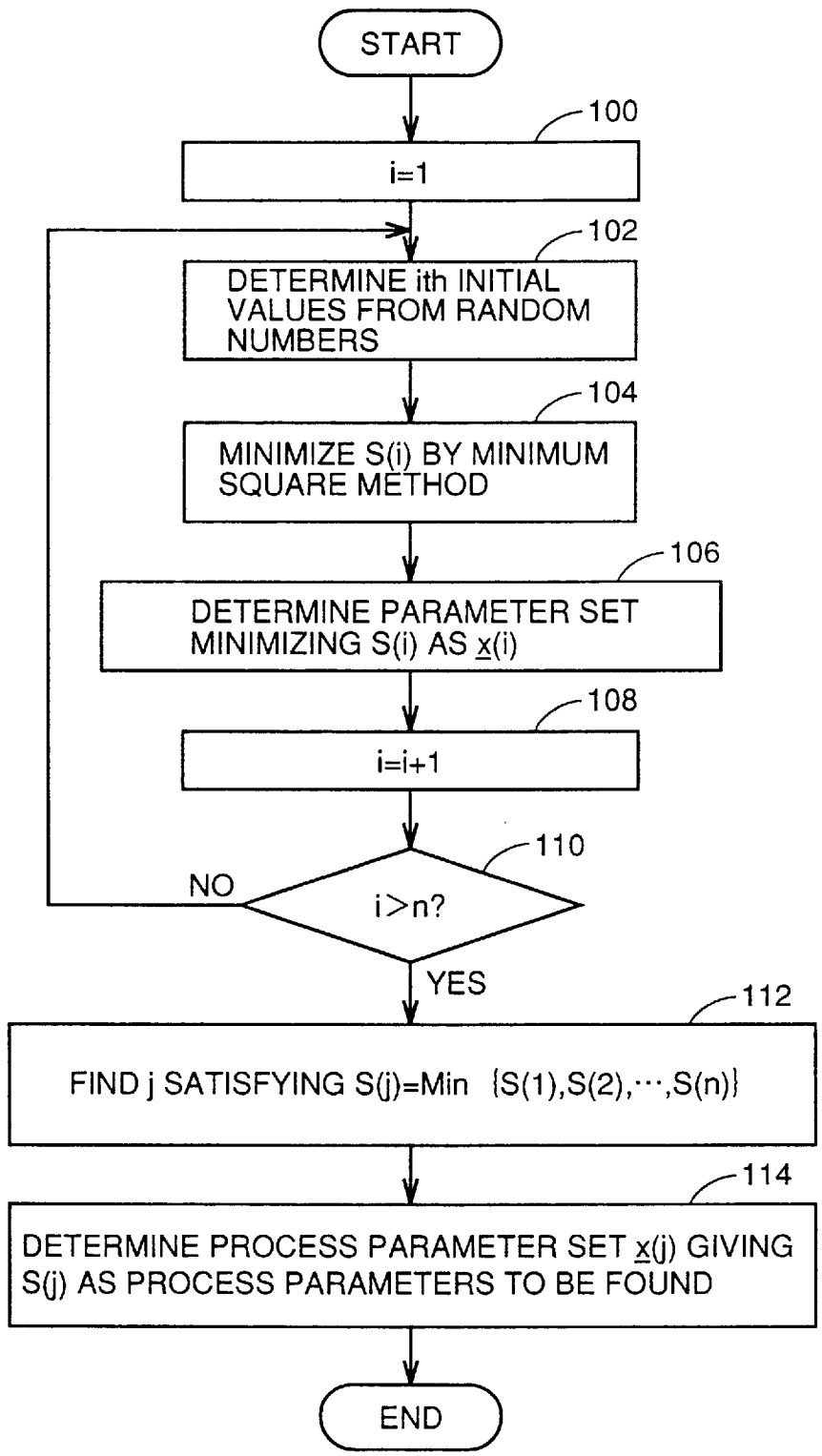
FIG. 16 is a flow chart showing steps of extracting a process parameter in a second embodiment.

FIG. 16 is a flow chart showing the processing according to the above method. First, the variable i is substituted for by one (step 100). An ith initial value is determined from random numbers (step 102). Starting from this initial value, calculation is repeated in accordance with the method already described in connection with the first embodiment until the sum of squares S(i) is minimized in the minimum square method (step 104). A set of process parameters which minimize S(i) thus found is referred to as x(i) (step 106). Then, i is increment by 1 (step 108). It is determined whether i is larger than the number (n) of the results to be found or not (step 110). If i is not larger than n, the control returns to step 102. If i is larger than n, the control advances to a step 112.

By the processing at steps 100–110 described above, n minimum sums of squares S(1), S(2), ..., S(n) are obtained. Among them, j giving the smallest value of S(j) is found (step 112). A set of the process parameters x(j) giving S(j) found at step 112 are determined as the process parameters to be found.

By the above processing, the process parameter corresponding to the minimum value having a high possibility of being the smallest value can be obtained as the optimum result, even if a plurality of minimum values exist.

[Embodiment 3]

With respect to the problem having a plurality of minimum values, the parameter value giving the smallest value may not be obtained, if the initial value of the parameter is inappropriate as already described in connection with the embodiment 2 (see FIG. 15). In this case, the simulated annealing method can be used, whereby the minimum value can be found without depending on the initial value.

According to the simulated-annealing method, the optimum value is not found by finding the convergence result by the algorithm of, e.g., Gauss-Newton method described before, but calculation is actually performed for various parameters to find the sums of squares S(i) thereof, so that a set of the process parameters among them which give the smallest values are selected as the process parameters.

Figure 17:
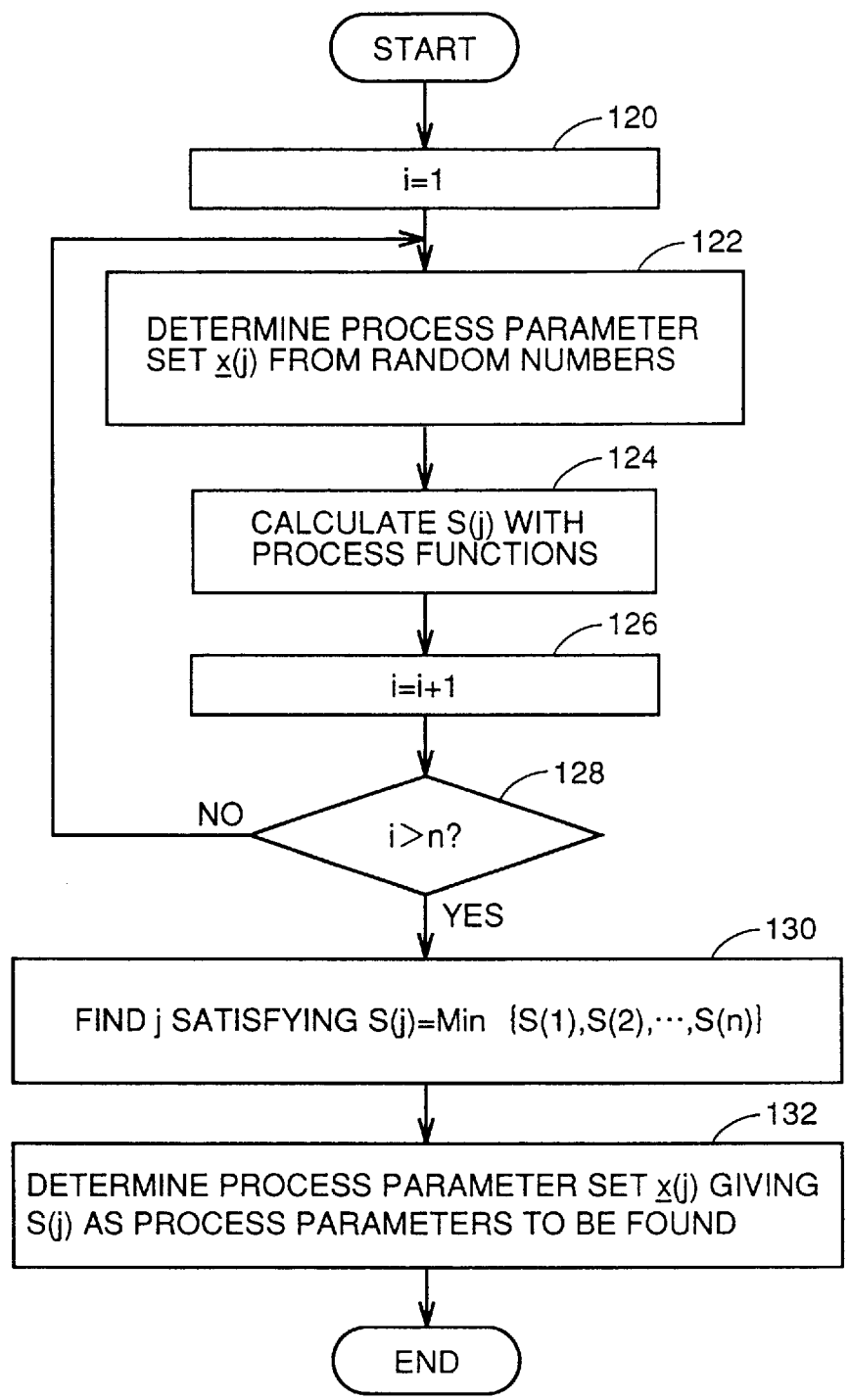
FIG. 17 is a flow chart showing steps of calculation in a third embodiment.

FIG. 17 is a flow chart showing steps for implementing the above method. Referring to FIG. 17, variable i is substituted for by one (step 120). A set of ith process parameters x(i) are determined from random numbers (step 122). Then, the process function is calculated with this set of process parameters x(i) to find the characteristic values, and the sum of squares S(i) for the characteristic values and specified values is calculated (step 124). At step 126, i is incremented by 1. If i is equal to or smaller than n, the control returns to step 122, and, if not, the control advances to step 130.

By repeating the processing at steps 122–128, sums of squares S(i) are calculated for n process parameters.

Processing is performed to find S(j) of the smallest value among these sums of squares S(1), S(2), ..., S(n). The set x(j) of process parameters giving S(j) is determined as the process parameters to be found.

Electric characteristics are calculated with the process function for the set of process parameters, and sum of squares S(i) is calculated for them and the specified values. The process parameters giving the smallest value among the calculated values are selected, whereby the smallest value can be found without depending on the initial value.

[Embodiment 4]

In the embodiments 2 and 3 already described, a plurality of optimum parameter sets may be found. In this case, any one of the parameter sets may be used as the optimum result, but it is desirable to select the optimum result in the following manner.

In general, even if the process parameter is determined, it is difficult to achieve the process conditions accurately coinciding with the process parameters due to factors such as control of the operation accuracy of the apparatus. Therefore, it is desirable to obtain the result which does not deviate from the specified value to a large extent even if the process condition may vary to some extent. Thus, It is desirable to select the result providing a larger process margin as the optimum result.

For the above purpose, if a plurality of optimum parameter sets are found as described above, sensitivity analysis of each parameter set is performed, and one of them having a lower sensitivity is selected as the optimum one. The "low sensitivity" means that the electrical characteristic changes only to a relatively small extent with respect to minute change of the parameter.

Figure 18:
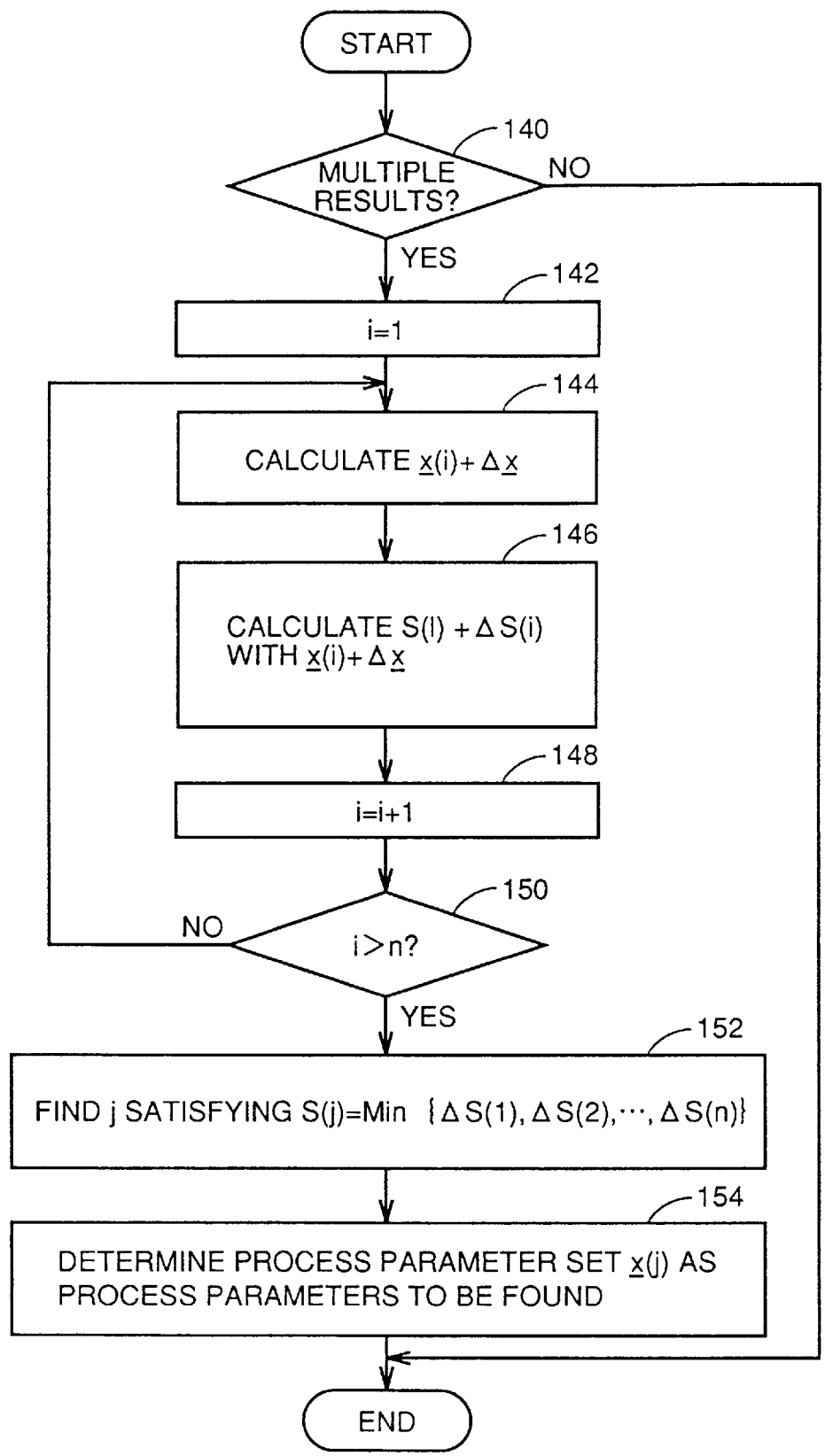
FIG. 18 is a flow chart showing steps of calculation in a fourth embodiment.

FIG. 18 is a flow chart of the processing for implementing the above method. The processing shown in FIG. 18 can be performed in such a case that a plurality of results are derived from the processing, e.g., in the embodiment 2 or 3.

At step 140, it is determined whether multiple optimum results are derived or not. If multiple optimum results are not derived, the following processing is not required.

It is assumed that there are n (n≧2) optimum results, which are expressed as x(i) (i=1 to n).

In step 142, variable i is substituted for by one. At next step 144, x(i)+Δx is calculated. Thus, a predetermined change is applied to this parameter set. At step 146, S(i)+ ΔS(i) is calculated with x(i)+Δx. Variation ΔS(i) in this case is determined by a predetermined formula representing a magnitude of variation. For example, it may be the sum of squares of difference between the value obtained by the calculation and the original value S(i) with respect to each parameter. At step 148, i is incremented by 1. If i is equal to or smaller than n, the control returns to step 144, and, if not, the control advances to step 152 (step 150).

At step 152, smallest value ΔS(j) is found among n variations ΔS(1), ΔS($^2$), ..., ΔS(n) obtained as described above. The process parameter set x(j) giving the smallest value ΔS(j) is selected as the process parameter to be found.

Selection of the optimum result in the above manner increases a process margin for actual manufacturing, which reduces a possibility that the actually manufactured semiconductor device exhibits the characteristics significantly deviated from the specified values.

[Embodiment 5]

Meanwhile, if the process parameters are large in number the quantity of calculation is large according to the foregoing calculation. Restriction may be imposed on a part of process parameters due to restriction, e.g., by the manufacturing apparatus. This embodiment 5 provides a method which allows efficient extraction of the process parameters even in such a case.

Briefly, the method of embodiment 5 is performed in such a manner that after selecting and optimizing only parameters of a high sensitivity, optimization is performed again on only parameters of a low sensitivity while maintaining the optimum values of these parameters of the high sensitivity at fixed values. This reduces the quantity of calculation of parameters, so that extraction can be performed more efficiently than the case where entire optimization is performed at one time.

Figure 19:
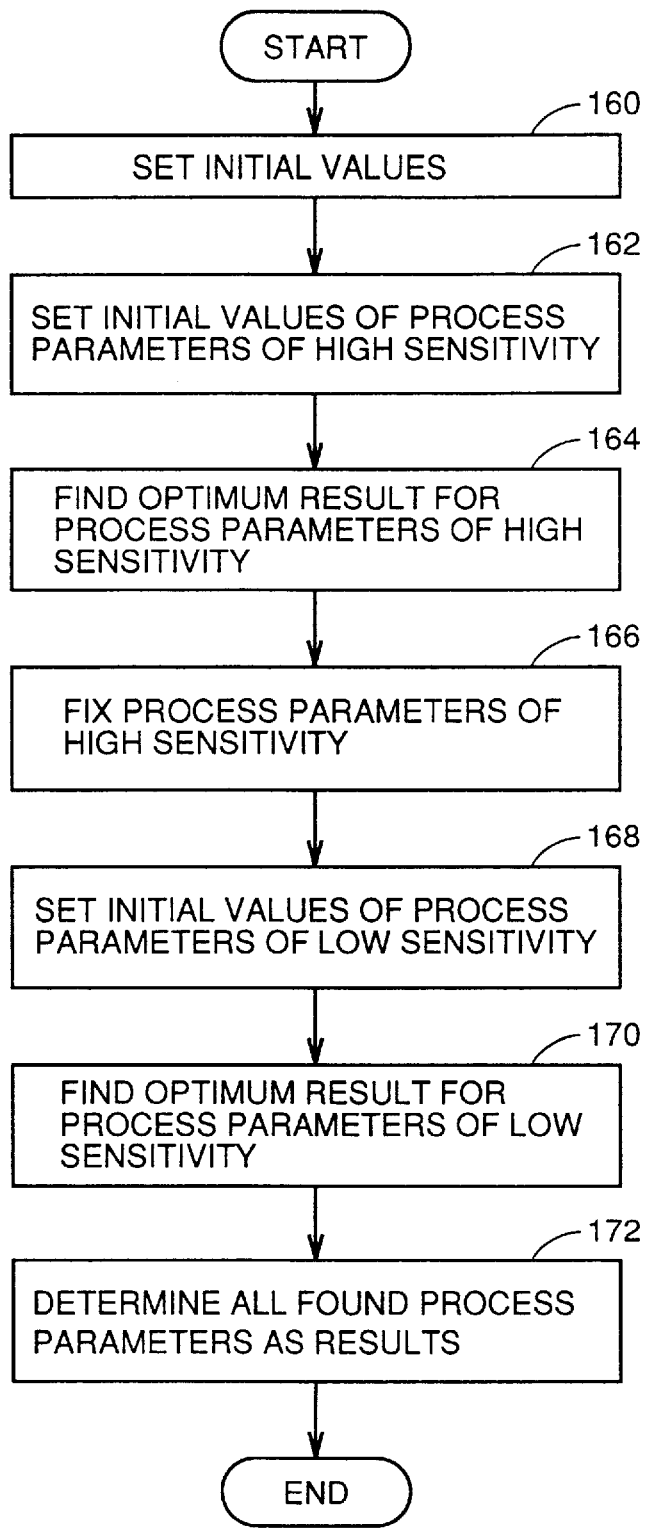
FIG. 19 is a flow chart showing steps in a process according to a fifth embodiment.

FIG. 19 shows a flow chart for such processing. First, the specified value is set (step 160). The initial values of the process parameters of the high sensitivity are set (step 162). The optimum result for the process parameters of the high sensitivity is found (step 164). This processing itself may be any one among those described in the embodiments 1 to 4 or combination of them. According to the above processing, the optimum values for the process parameters of the high sensitivity can be obtained.

Then, the process parameters of the high sensitivity thus obtained are fixed (step 166). The initial values for the process parameters of the low sensitivity are set (step 168). Processing starting from the above initial values are performed for the process parameters of the low sensitivity to find the optimum result (step 170). This processing can also be any one among those described in the embodiments 1 to 4 or combination thereof.

In this manner, the optimum result can be found also for the process parameter of the low sensitivity. Since the result for the process parameter of the high sensitivity has already been found, finding of the optimum results for all the process parameters is completed at this step 172.

According to this method, extraction can be performed more efficiently than the case where all the parameters are optimized at one time. This method can also be applied to the case where restriction is imposed on a part of process parameters.

[Embodiment 6]

The methods in the embodiments 1 to 5 allows calculation of the optimum parameters. However, these methods still exhibit the problem that calculation is complicated. Accordingly, the embodiment 6 provides a method allowing more easy calculation.

Figure 20:
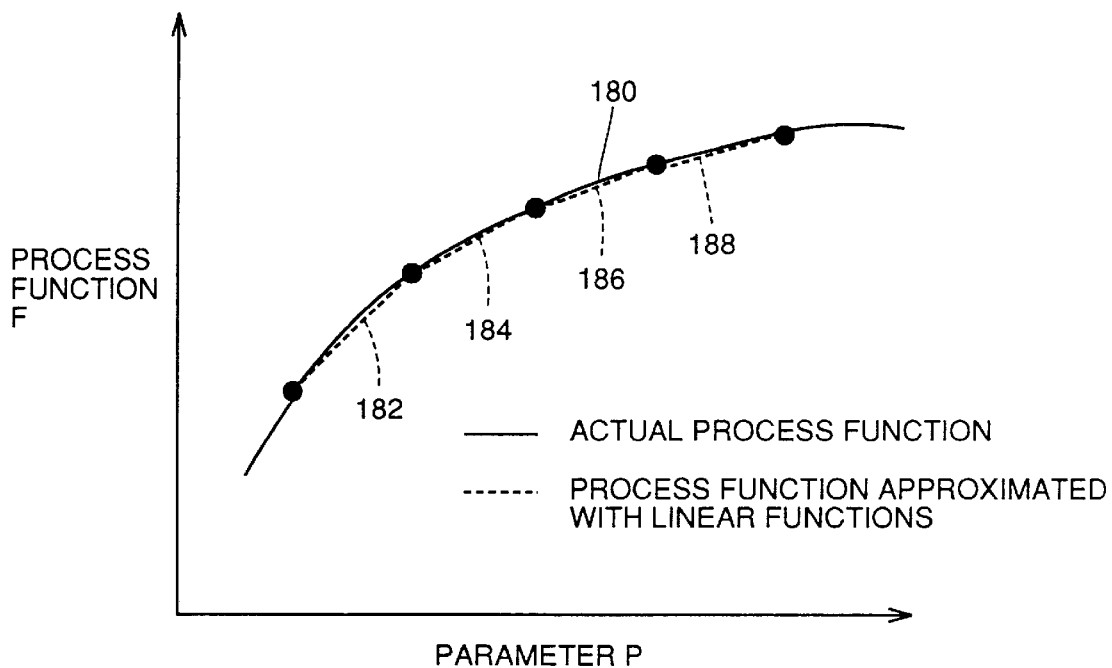
FIG. 20 schematically shows a process function according to a sixth embodiment.

As shown in FIG. 20, it is assumed in the following description that there exists a range of parameter in which the process function F (curve 180) with respect to parameter P monotonously increases or monotonously decreases. In this case, a range in which the parameter is variable is restricted to the above range. Thus, the variable range of process parameter is restricted to the range in which the process function monotonously increases or decreases. The process function in this range is approximately expressed by a linear function or combination thereof. In FIG. 20, curve 180 is approximately represented by four straight lines 182, 184, 186 and 188. By approximately representing the process function, which is represented by the complicated curve, by the linear functions, linear programming can be used, and the optimum result can be found by simple calculation. Further, the process function exhibits monotonous increase or decrease in this range, so that the optimum parameter setting can be surely and uniquely determined. Further, it might be possible to first find the parameter values in the above-described manner, and then the optimum result is found by any one of the methods in the embodiments 1 to 4 described before using the parameter values thus found as the initial value.

[Embodiment 7]

Description will be given on processing of finding the process function from an experimental result in the case where the process function includes two process parameters P and Q. It is assumed that, in the experiment, the process function value (e.g., a threshold voltage) is to be found while fixing parameter Q to, e.g., three values a, b and c, but varying parameter P. The experimental result will be as shown in a graph of FIG. 21 in which the abscissa represents the value of P and the ordinate represents the value of process function F(P, Q). It can be considered that, with respect to a certain value of Q, F is a function of P having a predetermined relationship with P. However, if Q varies, behavior of F with respect to the change of P also changes. Therefore, the values of process function F(P, Q) are distributed in a belt-like fashion as shown in FIG. 21.

Figure 21:
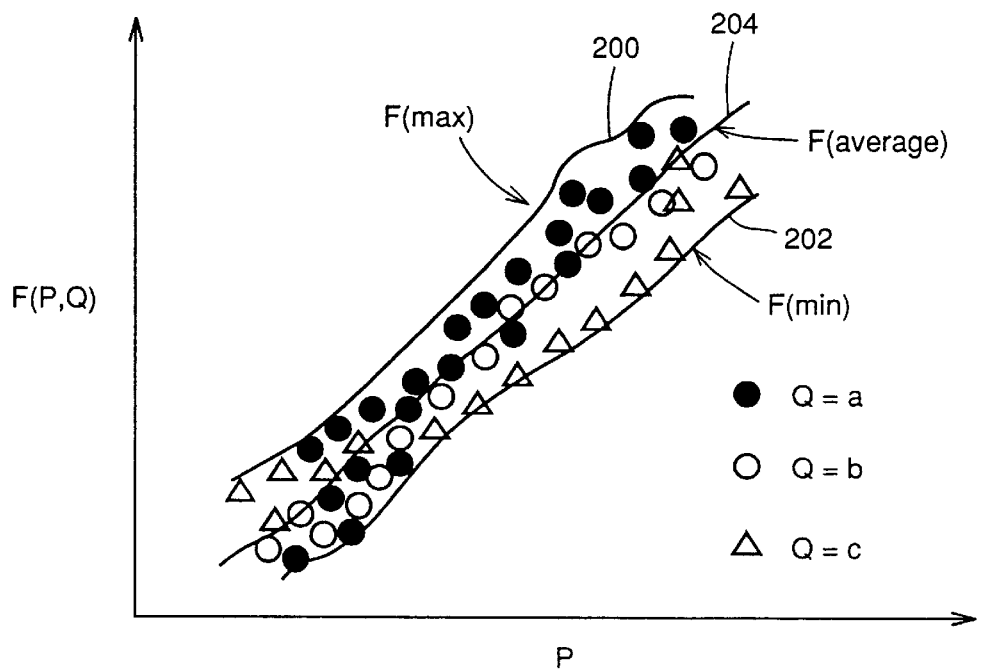
FIG. 21 schematically shows a distribution range of two process parameters P and Q, and a function F(P, Q) thereof.

In the distribution of the belt-like fashion shown in FIG. 21, envelopes F(max) 200 and F(min) 202 can be drawn. It can be deemed that envelope F(max) is a curve obtained by connecting the maximum values of F(P, Q) for three values (a, b and c) of Q with respect to a certain value of P. Likewise, it can be deemed that envelope F(min) is a curve obtained by connecting minimum values of F(P, Q) with respect to the certain value of P.

A center line F(average) 204 may be considered with respect to these two envelopes F(max) and F(min). It can be deemed that this center line is obtained by connecting averages of the values of envelopes F(max) and F(min) with respect to the values of parameter P. This center line F(average) 204 can be determined as the characteristic curve of process function F.

By determining F by this method, the central value in the range of the characteristic varied by variation of parameter Q becomes the value of the process function. Therefore, the optimum parameter value satisfying the specification can be advantageously obtained by the minimum square method without a significant influence by variation of a particular parameter.

Figure 22:
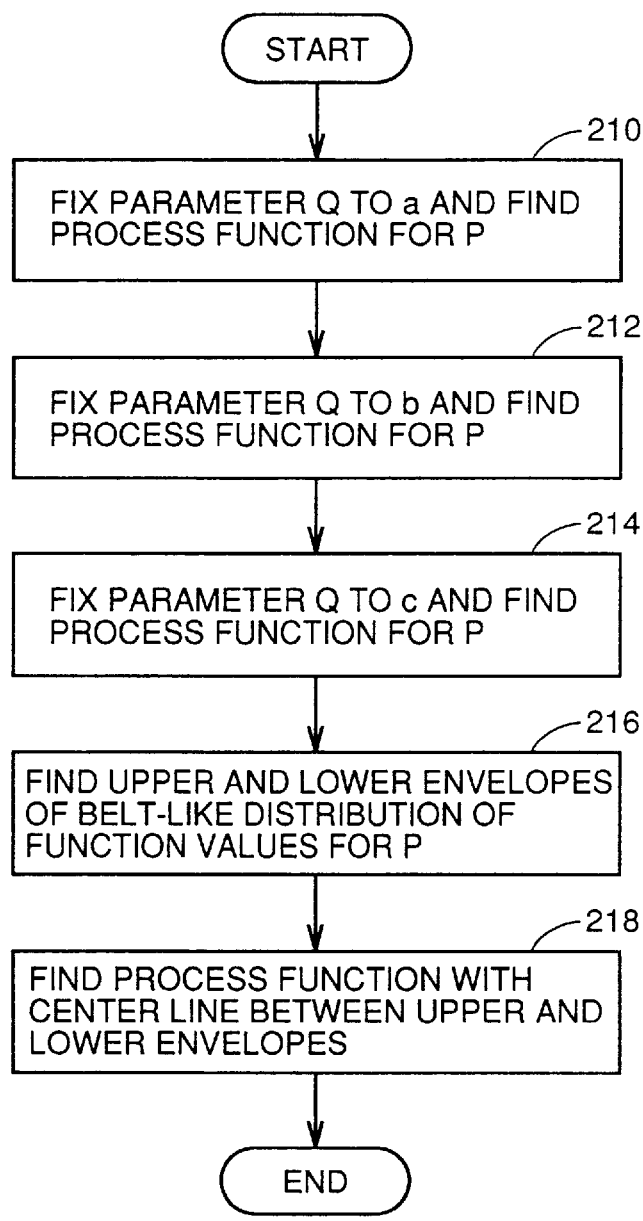
FIG. 22 is a flow chart showing steps in a process according to the sixth embodiment.

FIG. 22 is a flow chart showing the above processing. At step 210, parameter Q is fixed to a, and the process function value is obtained with respect to B. Similar processing is performed fixing parameter Q to b and c (steps 212 and 214), respectively. The upper and lower envelopes are determined with respect to the belt-like distribution of respective function values with respect to P (step 216). The center line with respect to the upper and lower envelopes thus obtained is determined as the process function (step 218).

By the processing described above, it is possible to obtain the optimum parameter value satisfying the specification without being significantly influenced by variation of a specific parameter.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A method of manufacturing a semiconductor device comprising the steps of:

describing a characteristic of the semiconductor device with process functions of process parameters in a process of manufacturing the semiconductor device, said process functions calibrated using past data or simulation results;

extracting a set of optimum process parameters satisfying an intended specification using said process functions; and manufacturing said semiconductor device by the manufacturing process according to said extracted process parameters.

2. The method of manufacturing the semiconductor device according to claim 1, wherein said step of describing said characteristic includes the step of determining the process functions based on experimental values.

3. The method of manufacturing the semiconductor device according to claim 1, wherein said step of describing said characteristic includes the step of determining the process functions based on simulated values.

4. The method of manufacturing the semiconductor device according to claim 1, wherein said step of describing said characteristic includes the step of determining the process functions using both experimental values and simulated values.

5. The method of manufacturing the semiconductor device according to claim 1, wherein said process function are described with a plurality of linear functions.

6. The method of manufacturing the semiconductor device according to claim 1, wherein said step of describing said characteristic includes the steps of:

determining a plurality of process functions each describing a characteristic given by corresponding one of process steps to the semiconductor device; and representing each of the characteristics of the semiconductor device by linear combination of said plurality of process functions.

7. The method of manufacturing the semiconductor device according to claim 1, wherein said step of extracting said process parameters uses a Gauss-Newton method.

8. The method of manufacturing the semiconductor device according to claim 1, wherein said step of extracting said process parameters uses a Levenberg-Marquardt method.

9. The method of manufacturing the semiconductor device according to claim 1, wherein said step of extracting said process parameters uses a Denis-Gay-Welsch method.

10. The method of manufacturing the semiconductor device according to claim 1, wherein said step of extracting said process parameters uses a Biggs method.

11. The method of manufacturing the semiconductor device according to claim 8, wherein said step of extracting said process parameters includes the step of determining initial values with random numbers.

12. The method of manufacturing the semiconductor device according to claim 9, wherein said step of extracting said process parameters includes the step of determining initial values with random numbers.

13. The method of manufacturing the semiconductor device according to claim 10, wherein said step of extracting said process parameters includes the step of determining initial values with random numbers.

14. The method of manufacturing the semiconductor device according to claim 1, wherein said step of extracting said process parameters uses a simulated-annealing method.

15. The method of manufacturing the semiconductor device according to claim 1, wherein said step of extracting said process parameters includes the step of determining upper and lower limits of at least one of the process parameters and extracting said one of the process parameters in a range between said upper and lower limits.

16. The method of manufacturing the semiconductor device according to claim 1, wherein said step of extracting said process parameters includes the steps of:

limiting a range for deriving the process parameters to a range in which at least one of said process parameters changes monotonously; and extracting an optimum of said at least one of said process parameters from said limited range.

17. The method of manufacturing the semiconductor device according to claim 1, wherein said step of extracting said process parameters includes the step of extracting all the process parameters at one time.

18. The method of manufacturing the semiconductor device according to claim 1, wherein said step of extracting said process parameters includes:

a first step of extracting a part of the process parameters at one time; and a second step of fixing values of said process parameters extracted at said first step and extracting the remaining process parameters.

19. The method of manufacturing the semiconductor device according to claim 18, wherein only the process parameters of a relatively high sensitivity among said process parameters are initially extracted at said first step, and only the process parameters of a relatively low sensitivity are extracted at said second step.

20. The method of manufacturing the semiconductor device according to claim 1, further comprising the steps of:

determining whether a plurality of optimum results are found or not;

performing sensitivity analysis on each of said plurality of found optimum results, if said plurality of optimum results are found; and selecting the optimum results determined to have the lowest sensitivity as a set of the optimum process parameters, if said plurality of optimum results are found.

21. The method of manufacturing the semiconductor device according to claim 1, wherein said step of manufacturing said semiconductor device includes the steps of:

transmitting the extracted process parameters to a manufacturing factory via transmitting means; and manufacturing the semiconductor device in accordance with the condition complying with the transmitted process parameters in the manufacturing factory.

22. The method of manufacturing the semiconductor device according to claim 1, wherein a certain process functions is a function of a plurality of process parameters, and said step of describing the characteristic with the process functions includes the steps of:

fixing a part of the process parameters to a plurality of values, respectively, and variously changing the remaining process parameters to find a distribution range of the function values of the process function with respect to each value of the remaining process parameters; and extracting a central value in the found distribution range with respect to each value of said remaining process parameters and determining a series of said central values as said process function.

* * * * *